(12) United States Patent
Stansbury et al.

(10) Patent No.: US 11,479,620 B2
(45) Date of Patent: Oct. 25, 2022

(54) 3D PRINTING WITH POLYMERIC NANOGEL PARTICLES

(71) Applicant: THE REGENTS OF THE UNIVERSITY OF COLORADO, Denver, CO (US)

(72) Inventors: Jeffrey W. Stansbury, Denver, CO (US); Parag K. Shah, Denver, CO (US); Robert R. McLeod, Denver, CO (US)

(73) Assignee: THE REGENTS OF THE UNIVERSITY OF COLORADO, Denver, CO (US)

( * ) Notice: Subject to any disclaimer, the term of this patent is extended or adjusted under 35 U.S.C. 154(b) by 367 days.

(21) Appl. No.: 16/648,158

(22) PCT Filed: Sep. 18, 2018

(86) PCT No.: PCT/US2018/051598
§ 371 (c)(1),
(2) Date: Mar. 17, 2020

(87) PCT Pub. No.: WO2019/056019
PCT Pub. Date: Mar. 21, 2019

(65) Prior Publication Data
US 2020/0283548 A1 Sep. 10, 2020

Related U.S. Application Data

(60) Provisional application No. 62/559,794, filed on Sep. 18, 2017.

(51) Int. Cl.
*C08F 220/10* (2006.01)
*C08F 220/12* (2006.01)
(Continued)

(52) U.S. Cl.
CPC .............. *C08F 2/46* (2013.01); *B29C 64/112* (2017.08); *B29C 64/124* (2017.08);
(Continued)

(58) Field of Classification Search
CPC ... B29C 64/106; B29C 64/112; B29C 64/124; B29C 64/129; B29C 64/135;
(Continued)

(56) References Cited

U.S. PATENT DOCUMENTS 9,138,383 B1    9/2015  Stansbury
2003/0207204 A1* 11/2003 Sugasaki ............... G03F 7/0388
                                            264/401 X (Continued)

FOREIGN PATENT DOCUMENTS

WO    2017112682 A1   6/2017
WO    2017223511 A1   12/2017

OTHER PUBLICATIONS

Bland et al.; "Photopolymerized multifunctional (meth)acrylates as model polymers for dental applications"; Biomaterials, vol. 17, No. 11; Jun. 1996, pp. 1110-1114.
(Continued)

*Primary Examiner* — Leo B Tentoni
(74) *Attorney, Agent, or Firm* — Cantor Colburn LLP

(57) ABSTRACT

A photoinitiated polymerizable composition for 3D printing, the polymerizable composition comprising a nanogel component that comprises nanogel particles, wherein the nanogel particles comprise a copolymer with polymerizable reactive groups suitable for reacting with each other or a reactive diluent monomer, a reactive oligomer, a resin, or a combination thereof that is present in the polymerizable composition upon photoinitiation, wherein the nanogel component has a glass transition temperature that is in a range of about −50 C and about 20 C and an average molecular
(Continued)

weight that is in a range of about 10 kg/mol and about 100 kg/mol, and wherein the nanoparticles have an average hydrodynamic radius that is in a range of 1 nm to about 5 nm.

13 Claims, 14 Drawing Sheets

(51) Int. Cl.
| | | |
|---|---|---|
| C08F 220/14 | (2006.01) | |
| C08F 220/16 | (2006.01) | |
| C08F 220/18 | (2006.01) | |
| C08F 220/20 | (2006.01) | |
| C08F 220/36 | (2006.01) | |
| C08F 220/40 | (2006.01) | |
| C08F 222/02 | (2006.01) | |
| C08F 222/10 | (2006.01) | |
| C08F 2/46 | (2006.01) | |
| B33Y 10/00 | (2015.01) | |
| B33Y 70/00 | (2020.01) | |
| B29C 64/165 | (2017.01) | |
| B33Y 40/20 | (2020.01) | |
| C08F 8/30 | (2006.01) | |
| C08K 5/5397 | (2006.01) | |
| B29C 64/112 | (2017.01) | |
| B29C 64/124 | (2017.01) | |
| B29K 33/00 | (2006.01) | |
| B29K 35/00 | (2006.01) | |
| B29K 105/00 | (2006.01) | |
| B82Y 30/00 | (2011.01) | |

(52) U.S. Cl.
CPC ............ *B29C 64/165* (2017.08); *B33Y 10/00* (2014.12); *B33Y 40/20* (2020.01); *B33Y 70/00* (2014.12); *C08F 8/30* (2013.01); *C08F 220/1811* (2020.02); *C08F 222/102* (2020.02); *C08K 5/5397* (2013.01); *B29K 2033/08* (2013.01); *B29K 2035/00* (2013.01); *B29K 2105/0061* (2013.01); *B82Y 30/00* (2013.01); *C08F 220/1802* (2020.02); *C08F 220/1803* (2020.02); *C08F 220/1804* (2020.02); *C08F 220/1805* (2020.02); *C08F 220/1806* (2020.02); *C08F 220/1807* (2020.02); *C08F 220/1808* (2020.02); *C08F 220/1809* (2020.02); *C08F 220/1812* (2020.02); *C08F 220/1818* (2020.02); *C08F 222/1006* (2013.01); *C08F 2438/03* (2013.01)

(58) Field of Classification Search
CPC ....... B33Y 10/00; B33Y 70/00; C08F 220/10; C08F 220/12; C08F 220/14; C08F 220/16; C08F 220/18; C08F 220/1802; C08F 220/1803; C08F 220/1804; C08F 220/1805; C08F 220/1806; C08F 220/1807; C08F 220/1808; C08F 220/1809; C08F 220/1811; C08F 220/1812; C08F 220/1818; C08F 220/20; C08F 220/36; C08F 220/40; C08F 222/02; C08F 222/10; C08F 222/1006; C08F 222/102
USPC .................. 264/308, 401; 522/178, 182, 184
See application file for complete search history.

(56) References Cited

U.S. PATENT DOCUMENTS

| | | | |
|---|---|---|---|
| 2006/0252900 A1* | 11/2006 | Bowman ............... | C08F 220/26 549/36 |
| 2013/0287980 A1 | 10/2013 | Burdzy et al. | |
| 2014/0131908 A1 | 5/2014 | Sun et al. | |
| 2014/0283983 A1* | 9/2014 | Schall .................. | C08F 220/54 525/89 |
| 2015/0051310 A1 | 2/2015 | Stansbury | |

OTHER PUBLICATIONS

International Search Report for International Application No. PCT/US2018/051598, International Filing Date Sep. 18, 2018, dated Nov. 29, 2018, 3 pages.

Rogers et al.; "Glass formation in polymers. I. The glass transitions of the poly-(n-alkyl methacrylates)"; The Journal of Physical Chemistry, vol. 61; Jul. 1957, pp. 985-990.

Stansbury et al.; "3D Printing with polymers: Challenges among expanding options and opportunities"; Dental Materials, vol. 32; Jan. 2016, 11 pages.

Written Opinion for International Application No. PCT/US2018/051598, International Filing Date Sep. 18, 2018, dated Nov. 29, 2018, 6 pages.

Bail et al., "Effect of a red-shifted benzotriazole UV absorber on caring depth and kinetics in visible light initiated photopolymer resins for 3D printing" Journal of Industrial and Engineering Chemistry 38 (2016) 141-145.

* cited by examiner

Nanogel

Nanogel particles 300 x 900 μm with 900 μm spacing

TEGDMA 25 wt% Nanogel 50 wt% Nanogel 75 wt% Nanogel

TEGDMA control

Nanogel swollen with TEGDMA

3D PRINTING WITH POLYMERIC NANOGEL PARTICLES

CROSS-REFERENCE TO RELATED APPLICATIONS

The present application is a 35 U.S.C. § 371 National Phase Application of International Patent Application No. PCT/US2018/051598, filed Sep. 18, 2018, claiming the benefit of U.S. Provisional Application No. 62/559,794, filed Sep. 18, 2017, which are incorporated herein by reference in their entireties.

STATEMENT REGARDING FEDERALLY SPONSORED RESEARCH OR DEVELOPMENT

This invention was made with government support under R01DE022348 awarded by National Institutes of Health. The government has certain rights in the invention.

BACKGROUND OF INVENTION

Photopolymer-based three-dimensional printing is used widely with conventional techniques including the stereo lithography apparatus (SLA), digital light processing (DLP), continuous liquid interface production (CLIP), and polyjet/inkjet printing. Problems or concerns with current 3D printing operations and resulting products include, for example, anisotropy in mechanical properties, volumetric shrinkage and shrinkage stress, diffusion of monomer and radical species across interfaces, which tends to results in distortion of edges, conversion gradients in formed layers.

Thus, a need still exists for polymerizable materials suitable for 3D printing and/or methods of 3D printing that addresses one or more of these problems.

SUMMARY OF INVENTION

In one embodiment the present invention is directed to a photoinitiated polymerizable composition for 3D printing, the polymerizable composition comprising:
(a) a nanogel component that comprises nanogel particles, wherein the nanogel particles comprise a copolymer with polymerizable reactive groups suitable for reacting with each other or with a reactive diluent monomer, a reactive oligomer, a resin, or a combination thereof that is present in the polymerizable composition upon photoinitiation, wherein:
   (i) the copolymer is the polymerized product of a mixture that comprises a monovinyl monomer, a divinyl monomer, and a chain transfer agent, wherein the divinyl monomer is at a concentration in a range of about 20 mol % to about 80 mol % of the monomer content of the mixture;
   (ii) the polymerizable reactive groups of the copolymer are at a concentration that is in a range of about 5% to about 20% of the reactive group density of the divinyl monomer;
   (iii) at least one of the monovinyl monomer and the divinyl monomer is a glassy polymer when homopolymerized and at least one of the monovinyl monomer and the divinyl monomer is a rubbery polymer when homopolymerized;
   (iv) the nanogel component has a glass transition temperature (Tg), corresponding to the peak of a tan delta plot created via Dynamic Mechanical Analysis (DMA), is in a range of about −50° C. and about 20° C.;
   (v) the nanogel component has an average molecular weight (Mn), determined with triple-detector gel permeation chromatography (TD-GPC) analysis, that is in a range of about 10 kg/mol and about 100 kg/mol; and
   (vi) the nanoparticles have an average hydrodynamic radius (Rh), determined by light scattering while conducting a TD-GPC analysis, that is in a range of 1 nm to about 5 nm; and
(b) optionally, the reactive diluent monomer, a reactive oligomer, a resin, or a combination thereof at a concentration up to about 60 wt % of the polymerizable composition;
(c) a photoinitiator at an amount effective to initiate said reactions in the presence of curing radiation of appropriate wavelength and irradiance; and
(d) a wavelength compatible radiation absorber at an amount effective for control of radiation transmission depth of the curing radiation.

Another embodiment of the present invention is directed to a method of making the foregoing photoinitiated polymerizable composition, the method comprising combining: the nanogel component; the optional reactive diluent monomer, a reactive oligomer, a resin, or a combination thereof if it/they is/are to be present in the photoinitiated polymerizable composition; the photoinitiator; and the wavelength compatible radiation absorber.

Another embodiment of the present invention is directed to a method of producing a three-dimensional object from the foregoing photoinitiated polymerizable composition, the method comprising sequentially exposing immediately adjacent volumes of the photoinitiated polymerizable composition to curing radiation thereby initiating the polymerization of the polymerizable composition in said volumes to form corresponding sequential immediately adjacent layers of the three-dimensional object until the three-dimensional object is completed.

DETAILED DESCRIPTION OF INVENTION

Figure 1:
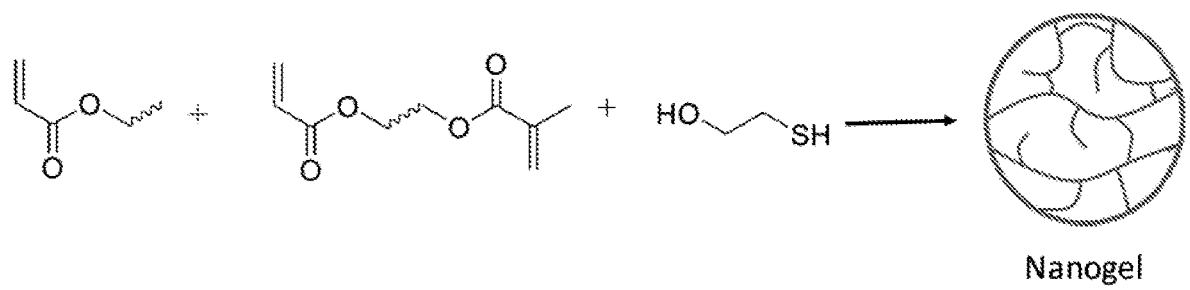
FIG. 1 depicts a chemical reaction between monovinyl and divinyl comonomers in a solvent with a chain transfer agent to form a nanogel.

As indicated above, in one embodiment, the present invention directed to a photoinitiated polymerizable composition that comprises: (a) a nanogel component; (b) an optional reactive diluent monomer, a reactive oligomer, a resin, or a combination; (c) photoinitiator at an amount effective to initiate said polymerization reactions in the presence of curing radiation of appropriate wavelength and irradiance; and (d) a wavelength compatible radiation absorber at an amount effective for control of radiation transmission depth of the curing radiation.

As will be apparent from the disclosure herein, the presence of a substantial amount of the nanogel in the polymerizable composition induces mobility restriction in the composition, which tends to reduce or eliminate migration of constituents in the composition during curing and promote further curing of the composition that is not completely cured after exposure to radiation.

Terminology

A "polymer" is a substance composed of macromolecules. A polymer macromolecule is a molecule of high relative molecular mass, the structure of which comprises the multiple repetition of units derived from molecules of low relative molecular mass.

A "branched polymer" is a polymer that includes side chains of repeat units connecting onto the main chain of repeat units (different from side chains already present in the monomers). A branched polymer refers to a non-linear polymer structure, but typically, not a network structure. Therefore, a trace forward from the branch point would not bridge back to the original main chain (i.e., minimal or no backbone crosslinking is present). A branched polymer would generally be soluble in an appropriate solvent.

A "crosslinked polymer" is a polymer that includes interconnections between chains, either formed during polymerization (by choice of monomer) or after polymerization (by addition of a specific reagent). In a crosslinked polymer network, with the crosslinks serving as branch points, it is possible to trace a continuous loop back to the backbone. The crosslinked network would be insoluble in all solvents.

A "network polymer" is a crosslinked polymer that includes two or more connections, on average, between chains such that the entire sample is, or could be, a single molecule. Limited crosslink connections per chain would be considered lightly crosslinked while numerous crosslinks would be considered highly (or heavily) crosslinked.

A "copolymer" is a material created by polymerizing a mixture of two, or more, starting compounds. The resultant polymer molecules contain the monomers in a proportion which is related both to the mole fraction of the monomers in the starting mixture and to the reaction mechanism.

A "filler" is a solid extender which may be added to a polymer to modify mechanical, optical, electrical, thermal, flammable properties, or simply to act as an extender. The filler can be reactive or inert in the polymerization.

An "extender" is a substance added to a polymer to increase its volume without substantially altering the desirable properties of the polymer.

The term "inert matrix" comprises, for example, water, an inert solvent, or a combination of water and an inert solvent.

The term "alkyl", "aliphatic" or "aliphatic group" as used herein means a straight-chain or branched $C_{1-20}$ hydrocarbon chain that is completely saturated or that contains one or more units of unsaturation, or a monocyclic $C_{3-8}$ hydrocarbon or bicyclic $C_{8-12}$ hydrocarbon that is completely saturated or that contains one or more units of unsaturation, but which is not aromatic (also referred to herein as "carbocycle" or "cycloalkyl"), that has a single point of attachment to the rest of the molecule wherein any individual ring in said bicyclic ring system has 3-7 members. For example, suitable alkyl groups include, but are not limited to, linear or branched or alkyl, alkenyl, alkynyl groups and hybrids thereof such as (cycloalkyl)alkyl, (cycloalkenyl)alkyl or (cycloalkyl)alkenyl.

The terms "alkoxy," "hydroxyalkyl," "alkoxyalkyl" and "alkoxycarbonyl," used alone or as part of a larger moiety include both straight and branched chains containing one to twelve carbon atoms. The terms "alkenyl" and "alkynyl" used alone or as part of a larger moiety shall include both straight and branched chains containing two to twelve carbon atoms.

The term "heteroatom" means nitrogen, oxygen, or sulfur and includes any oxidized form of nitrogen and sulfur, and the quaternized form of any basic nitrogen. The term "aryl" used alone or in combination with other terms, refers to monocyclic, bicyclic or tricyclic carbocyclic ring systems having a total of five to fourteen ring members, wherein at least one ring in the system is aromatic and wherein each ring in the system contains 3 to 8 ring members. The term "aryl" may be used interchangeably with the term "aryl ring". The term "aralkyl" refers to an alkyl group substituted by an aryl. The term "aralkoxy" refers to an alkoxy group substituted by an aryl.

A vinyl, or "-ene," functional group suitable for embodiments of the present invention includes any monomer having one or more vinyl functional groups, i.e., reacting "—C=C—" groups. Synonyms for a vinyl functional group include the terms olefinic group, alkenyl group, and ethylenic group.

Nanogel Component

The nanogel component comprises a nanogel or nanogel particles, wherein the nanogel particles comprise a copolymer with (residual) polymerizable reactive groups suitable for reacting with each other or a reactive diluent monomer, a reactive oligomer, a resin, or a combination thereof that is present in the polymerizable composition upon photoinitiation. The copolymer is the polymerized product of a mixture that comprises a monovinyl monomer, a divinyl monomer, and a chain transfer agent.

Traditionally, the term "nanogel" means a polymer gel particle having any shape with an equivalent diameter of approximately a few to 100 nm. "Nanogel" describes the interconnected localized network structures as well as appropriately describing the physical dimensions of the polymer gel particle. Nanogels are typically soluble in the solvent in which they are made and nanogels may be further made to be soluble in various liquids as necessary depending on the monomers used in their manufacture. However, nanogels can also be prepared in the absence of solvent (in bulk) and subsequently dissolved in an appropriate solvent or monomer composition.

As used herein, the term "nanogel", that is a soluble polymer particulate (or perhaps more accurately described as forming a stable, colloidal-like dispersion), is defined as a soluble, porous polymer gel particle having any shape with an equivalent diameter in a range of about 1 nm to about 200 nm, or greater, so long as the particle remains soluble in a target solvent or a monomer composition with which the nanogel is intended to be used. A nanogel is soluble in that it is uniformly dispersible as single discrete macromolecular structures in water, an aqueous solution, the target solvent, or a monomer composition.

Information regarding nanogels and methods of making nanogels is set forth, for example, in U.S. Pat. No. 9,138,383, which is incorporated herein by reference in its entirety.

There are broad options in the selection of monomers that can be used to produce the functional nanogels for use in 3D printing. An important factor for producing a desirable printable reactive nanogel-containing composition is its rheologic character. The polymerizable composition should have a viscosity appropriate for 3D printing which is generally necessary to have relatively low viscosity. Advantageously, sufficiently low viscosities may be realized with the nanogel component being a bulk or undiluted nanogel or when the nanogel is combined a monomer or monomers such that the nanogel loading is at least 40 wt % of the polymerizable composition. In another embodiment, the nanogel component is at an amount in a range of about 40 wt % to about 90 wt % of the photoinitiated polymerizable composition. In another embodiment, the nanogel component is at an amount in a range of about 50 wt % to about 80 wt % of the photoinitiated polymerizable composition. In yet another embodiment, the nanogel component is at an amount in a range of about 60 wt % to about 75 wt % of the photoinitiated polymerizable composition.

Exemplary monomers used to produce the printable nanogels include acrylate and methacrylate starting materials where a combination of monovinyl and divinyl comonomers are reacted in solution along with a chain transfer agent (FIG. 1). Polymerizable reactive groups or reactive sites on and within the nanogel particles are provided as pendant groups originating from the divinyl monomer and/or from polymerizable groups appended to the nanogel based on attachment to suitable functionality introduced by the monomers or chain transfer agent, such as the addition of isocyanatoethyl (meth)acrylate to the terminal alcohol groups derived from mercaptoethanol as the chain transfer agent. In one embodiment, the polymerizable reactive groups of the copolymer are at a concentration that is in a range of about 5% to about 20% of the concentration of reactive group density of the divinyl monomer.

In addition to the polymerizable reactive groups, the copolymer of the nanoparticles may also comprises secondary functional groups such as may be obtained using a fluorinated-containing monomers and siloxane-containing monomers that may be included in the nanogel syntheses to control the hydrophobicity of the copolymer.

Monovinyl Monomer

As used herein, a "monovinyl monomer" is a monomer having one polymerizable double bond per molecule. The monovinyl monomer may comprise any monomer which can be polymerized by a free-radical mechanism such as (meth)acrylates, styrene and derivatives thereof (styrenics), vinyl acetate, maleic anhydride, itaconic acid, N-alkyl (aryl) maleimides and N-vinyl pyrrolidone, vinyl pyridine, acrylamide, methacrylamide, N,N-dialkylmethacrylamides and acrylonitrile, and combinations thereof.

In one embodiment, the monovinyl monomer comprises one or more (meth)acrylates. Examples of suitable (meth) acylates include methyl(meth)acrylate, ethyl (meth)acrylate (EMA), propyl (meth)acrylate, n-butyl (meth)acrylate, iso-butyl (meth)acrylate, t-butyl (meth)acrylate, 2-ethylhexyl (meth)acrylate octyl (meth)acrylate, dodecyl (meth)acrylate, isodecyl methacrylate (IDMA), isostearyl (meth)acrylate, isobornyl methacrylate (IBMA), 2-ethylhexyl methacrylate (EHMA), hybrid acrylate/methacrylate prepared by the reaction of hydroxyethyl acrylate and isocyanatoethyl methacrylate (HEA+IEM), 2-phenoxyethyl (meth)acrylate, phenyl (meth)acrylate, p-t-butylphenyl (meth)acrylate, p-methoxyphenyl (meth)acrylate, p-tolyl (meth)acrylate, p-cyclohexylphenyl (meth)acrylate, p-nitophenyl (meth)acrylate, and benzoyl (meth)acrylate, 2-napthyl (meth)acrylate, (meth) acrylic acid, and combinations thereof.

As used herein, a "functional monomer" is a monomer having one or more additional reactive groups available for further polymerization or reaction of the nanogel particles. Such monomers include methacrylic acid and acrylic acid or other —COOH containing monomers (these embodiments are particularly suited for use with dental adhesives, sealants, and other dental materials); hydroxy alkyl acrylates such as hydroxy ethylacrylate (HEA); hydroxy alkyl (meth) acrylates such as hydroxyethyl(meth)acrylate (HEMA), polyethoxy ethyl methacrylate, hydroxypropyl(meth)acrylate and hydroxybutyl (meth)acrylate; oxirane containing (meth)acrylates (epoxy (meth)acrylates) such as glycidyl (meth)acrylate, and dialkyl aminoalkyl(meth)acrylates such as dimethylaminoethyl(meth)acrylate, diethylaminoethyl (meth)acrylate, dimethyl aminopropyl(meth)acrylate and diethylaminopropyl(meth)acrylate; and norbomyl (meth) acrylate.

Divinyl Monomer

As used herein, a "divinyl monomer" is a monomer having two polymerizable double bonds per molecule. Examples of suitable divinyl monomers include ethylene glycoldi(meth)acrylate, urethane di(meth)acrylate (UD(M) A), 2,2'-bis[4-(3-(meth)acryloxy-2-hydroxy propoxy)-phenyl] propane (bis-G(M)A), ethoxylated bisphenol-A-di (meth)acrylate (BisEMA), hexanediol di(meth)acrylate, poly(ethylene glycol) di(meth)acrylate, tripropylene glycol di(meth)acrylate, butanediol di(meth)acrylate, neopentyl glycol di(meth)acrylate, diethylene glycol di(meth)acrylate, triethylene glycol di(meth)acrylate, tetraethylene glycol di(meth)acrylate, dipropylene glycol di(meth)acrylate, allyl (meth)acrylate, divinyl benzene, 1,3 diglycerolatediacrylate, N,N-methylene bisacrylamide, and combinations thereof.

In one embodiment, the divinyl monomer is at a concentration in a range of about 20 mol % to about 80 mol % of the monomer content of the mixture for forming the nanogel.

Nanogel Compositions

The copolymerization of monovinyl and multivinyl monomers typically leads to macroscopically crosslinked polymeric networks, which are often referred to as macrogels. At a very early stage of these crosslinking polymerizations, the continuous network structure is formed and the polymer is becomes insoluble in all solvents. Embodiments of the present invention provide methods for controlling the polymerization process through use of chain transfer agents to yield shorter polymer chains that either delay macrogelation significantly or avoid it altogether, even at high degrees of monomer conversion. In one aspect, the molecular weight of the nanogel increases as the amount of chain transfer agent decreases. The resulting nanogel, which has internal cyclized and crosslinked structure but lacks macroscopic connectivity between the discrete particles, is soluble in appropriate solvents.

Nanogels can be approximated as dendritic or hyperbranched polymers since they can have continuously branching, connected structures. In network forming free radical chain polymerizations, the transient nanogel stage, which precedes macrogelation, is indicative of heterogeneous polymerization processes involving cyclization reactions and differential reactivities of free and pendant vinyl groups. Nanogels arise in di- or multi-vinyl polymerizations or in copolymerizations of these multifunctional monomers with monovinyl monomers. The incorporation of divinyl monomers in a polymerization generally results in crosslinked polymer formation. Crosslinked or macrogel polymers are by definition infinite molecular weight structures that are insoluble in any solvent. Macrogel polymers exist when the average number of crosslinks per chain exceeds two. In monovinyl/divinyl copolymerizations, the critical conversion (pc) at which gelation occurs can be predicted. In practice, the observed gel points are usually higher than the theoretical calculations because of cyclization reactions that decrease the so productive crosslink density. A chain transfer agent is required to controllably limit the length of the propagating chain such that bridging between growing nanogel regions is eliminated and the resulting high molecular weight polymeric nanogels are soluble.

The polymerization of the monomer mixture may be performed using nearly any appropriate free-radical polymerization method such as solution, suspension, and emulsion.

Chain Transfer Agent

A chain transfer agent is an intentionally added compound that terminates the growth of one polymer chain and then reinitiates polymerization to create a new chain. A chain transfer agent is used as a way to limit chain length. Exemplary chain transfer agents include aliphatic and aromatic monofunctional thiols, difunctional thiols, trifunctional thiols, tetrafunctional thiols, pentafunctional thiols, hexafunctional thiols, octafunctional thiols, and bis(boron-difluorodimethylglyoximate) cobaltate (II) and combinations thereof.

In one embodiment, the chain transfer agent is selected from the group consisting of is selected from the group consisting of propyl mercaptan, butyl mercaptan, hexyl mercaptan, octyl mercaptan, dodecanethiol, thioglycolic acid, methylbenzenethiol, dodecanethiol, mercaptopropionic acid, 2-ethyl hexyl thioglycolate, octylthioglycolate, mercaptoethanol, mercaptoundecanoic acid, thiolactic acid, thiobutyric acid, trimethylol propane tris(3-mercaptopropionate), pentaerythritol tetra(3-mercaptopropionate), pentaerythritol tetrathioglycolate, pentaerythritol tetrathiolactate, pentaerythritol tetrathiobutyrate; dipentaerythritol hexa (3-mercaptopropionate), dipentaerythritol hexathioglycolate; tripentaerythritol octa(3-mercaptopropionate), and tripentaerythritol octathioglycolate, and combinations thereof.

Initiation of the Polymerization of the Monovinyl and Divinyl Monomers

The polymerization of the monomers may be initiated by any suitable method of generating free-radicals such as by thermally induced decomposition of a thermal initiator such as an azo compound, peroxide or peroxyester. Alternatively, redox initiation or photoinitiation (see below for more detail) can be used to generate the reactive free radicals. Therefore the polymerization mixture also preferably contains a polymerization initiator which may be any of those known and conventionally used in free-radical polymerization reactions, e.g. azo initiators such as azobis(isobutyronitrile) (AIBN), azobis(2-methylbutyronitrile), azobis(2,4-dimethylvaleronitrile), azobis(4-cyanovaleric acid), peroxides such as dilauroyl peroxide, tert-butyl peroxyneodecanoate, dibenzoyl peroxide, cumyl peroxide, tert-butyl peroxy-2-ethyl hexanoate, tert-butyl peroxy diethyl acetate and tert-butyl peroxy benzoate. In a specific aspect, the thermal initiator is AIBN.

Glass Transition Temperature ($T_g$)

The glass transition temperature ($T_g$) of the resulting bulk nanogel must be below room temperature if it is to be fluid under ambient conditions. Ideally, the entire breadth of the thermal transition (tan delta peak as measured by dynamic mechanical thermal analysis) should be below room temperature. However, the thermal transition should not be too low or any final printed parts would be limited to rubbery materials.

In view of these considerations, in one embodiment the nanogel component has a glass transition temperature ($T_g$), corresponding to the peak of a tan delta plot created via Dynamic Mechanical Analysis (DMA), is in a range of about −50° C. and about 20° C. In another embodiment, the $T_g$ of the nanogel component is in a range of about −20° C. and about −10° C.

Average Molecular Weight ($M_n$)

Synthetic polymers have a distribution of molecular weights (MW, grams/mole). Polydispersity describes a polymer consisting of molecules with a variety of chain lengths and molecular weights. The width of a polymer's molecular weight distribution is estimated by calculating its polydispersity, Mw/Mn. The closer this approaches a value of 1, the narrower is the polymer's molecular weight distribution. The weight-average molecular weight (Mw) is the average molecular weight of a polydisperse polymer sample, averaged to give higher statistical weight to larger molecules; calculated as Mw=SUM($M_i^2$ Ni)/SUM(Mi Ni). One technique used to measure molecular weights of polymers is light scattering. A light shining through a very dilute solution of a polymer is scattered by the polymer molecules. The scattering intensity at any given angle is a function of the second power of the molecular weight. Consequently, because of this "square" function, large molecules will contribute much more to the calculated molecular weight than small molecules.

The number-average molecular weight (Mn) is the average molecular weight of a polydispersed polymer sample, averaged to give equal statistical weight to each molecule; calculated as Mn=SUM(Mi Ni)/SUM(Ni).

In one embodiment, the nanogel component has an average molecular weight ($M_n$), determined with triple-detector gel permeation chromatography (TD-GPC) analysis, that is in a range of about 10 kg/mol and about 100 kg/mol. In another embodiment, the $M_n$ of the nanogel component is in a range of about 15 kg/mol and about 30 kg/mol.

Average Hydrodynamic Radius ($R_h$)

The hydrodynamic radius is the radius of a particle or polymer molecule in solution that is determined from a measurement of mobility or diffusion, for example, in viscosity or dynamic light scattering experiments. The diffusion coefficient, D is related to the viscosity and the hydrodynamic radius, $R_H$ by: $D=k_BT/6\pi \eta R_H$; where $k_B$ is the Boltzmann constant and T is the absolute temperature.

In one embodiment, the nanoparticles have an average hydrodynamic radius (Rh), determined by light scattering while conducting a TD-GPC analysis, that is in a range of 1 nm to about 5 nm.

The sub-ambient Tg and the small nanoparticle diameters contribute significantly to producing bulk nanogels with viscosities that permit their use as printing materials. In one embodiment, at least one of the monovinyl monomer and the divinyl monomer is a glassy polymer when homopolymerized and at least one of the monovinyl monomer and the divinyl monomer is a rubbery polymer when homopolymerized. This coupled with the bulk nanogel being fluid at room temperature, but not presenting too low a Tg, contribute to the being able to produce a glassy printed polymer to be obtained via 3D printing of the polymerizable composition despite the relatively low reactive group concentrations associated with the nanogels and the use of no or minimal comonomer as a reactive diluent.

Reactive Diluent Monomer, a Reactive Oligomer, a Resin, or a Combination

The composition may optionally comprise a reactive diluent monomer, a reactive oligomer, a resin, or a combination thereof at a concentration up to about 60 wt % of the polymerizable composition. In another embodiment the reactive diluent monomer, a reactive oligomer, a resin, or a combination thereof, if present, is at an amount up to about 50 wt % of the photoinitiated polymerizable composition. In another embodiment, the reactive diluent monomer, a reactive oligomer, a resin, or a combination thereof is at an amount in a range of about 20 wt % to about 50 wt % of the photoinitiated polymerizable composition. In another embodiment, the reactive diluent monomer, a reactive oligomer, a resin, or a combination thereof is at an amount in a range of about 25 wt % to about 40 wt % of the photoinitiated polymerizable composition.

Typical reactive oligomers include, but are not limited to, epoxy-(meth)acrylates, polyether(meth)acrylates, polyester-(meth)acrylates and urethane-(meth)acrylates. Typical reactive polymers include addition or condensation polymers such as a styrene or acrylic copolymers containing pendant polymerizable (meth)acrylate groups or unsaturated polyesters. The molecular weight range of the oligomer or reactive polymer may vary from 500-500,000 g/mole or more preferably from about 5,000 to 10,000 MW. In addition, trivinyl monomer successfully has been used as the crosslinker (trimethylolpropane tri(meth)acrylate). It is anticipated that tri-, tetra, and multi-(meth)acrylates are suitable in embodiments of the present invention.

Photoinitiator

In one embodiment, the photoinitiator is selected from one or more of an alpha-hydroxyketone, a benzophenone, a thioxanthone, an alkylaminoacetophenone, an acyl phosphine oxide, and a benzyl ketal, a benzoin ether, a ketocoumain, 1,2-diketon, and combinations thereof.

In one embodiment, the photoinitiator is one or more acyl phosphine oxides selected from the group consisting of bis-acylphosphine oxide (BAPO), 2,4,6 trimethylbenzolyl-diphenylphosphine oxide (TPO), ethyl (2,4,6 trimethylbenzolyldiphenylphosphine oxide) (TPO-L), tris[1-(2-methyl) aziridinyl]phosphine oxide (MAPO), 2,2-dimethoxy-2-phenylacetophenone (DMPA), benzil dimethylketal (BDK), cyclohexylphenylketone (CPK), 2-hydroxy-2-methyl-1-phenyl propanone (HDMAP), isopropylthioxanthrone (ITX), hydroxyethyl-substituted alpha-hydroxyketone (HMPP), 2-methyl-4'-(methylthio)-2-morpholinopropiophenone (MMMP), 2-benzi1-2-dimethylamino-1-(4-morpholinophenyl)-butanone-1 (BDMB), Benzophenone (BP), methylthiophenyl-morpholinoketone (TPMK), 4-Methyl-benzophenone, 2-Methylbenzophenone, 1-Hydroxy cyclohexyl phenyl ketone, 2-Benzyl-2-(dimethylamino)-144-(4-morpholinyl)pheny1]-1-butanone, diphenyl iodonium hexafluorophosphate, bis (p-tolyl) iodonium hexafluorophosphate, 2-Methyl-1[4-(methylthio)phenyl11-2-morpholinopropanone-1,2-Hydroxy-2-methyl-phenyl-propan-I-one, 1,7-bis(9-acridinyl)heptane, 2-Hydroxy-4'-hydroxyethoxy-2-methylpropiophenone, 2,21-Bis(0-chlorophenyl-4,4',5,'-tetraphenyl-1,2'-diimidazole, 9-Phenylacridine, N-phenylglycine, 2-(4-methoxypheny1-4, 6-bis(trichloromethyl)-1,3,5-triazine, P-toluene sulfonylamine, tris-(4-dimethylaminophenyl)methane, tribromo methyl phenyl sulfone, 2,4-Bis(trichloromethyl)-6-(p-methoxy)styryl-s-triazine, 2,4-bis(trichloromethyl)-6-(3,4-dimethoxy)styryl-s-triazine, 4-(2-aminoethoxy)methyl benzophenone, 4-(2-hydroxyethoxy)methyl benzophenone, 2-Isopropylthioxanthone, 4-Isopropylthioxanthone, 4-Hydroxy benzophenone, 4-Methyl acetophenone, 4-(4-Methylphenylthiophenyl)-phenylmethanone, dimethoxyphenylacetophenone, camphorquinone, 1-Chloro-4-propoxythioxanthone, 2-Chlorothioxanthone, 2,2-Diethoxyacetophenone, 2,4-Diethylthioxanthone, 2-Dimethyl-aminoethylbenzoate, 2-Ethylhexyl-4-dimethylaminobenzoate, Ethyl-4-(dimethylamino) benzoate, 2-Isopropylthioxanthone, Methyl o-benzoyl benzoate, Methyl phenyl glyoxylate, 4,4'-Bis(diethylamino) benzophenone, 4-Phenylbenzophenone, 2,4,6- and Ethyl (2,4,6-trimethylbenzoyl) phenylphosphinate.

The photoinitiator at an amount effective to initiate said reactions in the presence of curing radiation of appropriate wavelength and irradiance. Typically, the effective amount is in a range of about 0.01 wt % to about 10 wt % of the photoinitiated polymerizable composition. In another embodiment, the photoinitiator is at an amount in a range of about 0.05 wt % to about 7 wt % of the photoinitiated polymerizable composition. In another embodiment, the photoinitiator is at an amount in a range of about 0.1 wt % to about 5 wt % of the photoinitiated polymerizable composition.

Wavelength Compatible Radiation Absorber

As indicated above, the photopolymerizable composition also comprises a wavelength compatible radiation absorber at an amount effective for control of radiation transmission depth. Exemplary absorbers include organic compounds such as benzophenones, benzotriazoles, triazines and other compounds such as titanium dioxide, zinc oxide, carbon black, and combinations thereof.

Typically, the effective amount is at an amount in a range of about 0.005 wt % to about 5 wt % of the photoinitiated polymerizable composition. In another embodiment, the wavelength compatible radiation absorber is at an amount in a range of about 0.05 wt % to about 2 wt % of the photoinitiated polymerizable composition. In another embodiment, the wavelength compatible radiation absorber is at an amount in a range of about 0.1 wt % to about 1 wt % of the photoinitiated polymerizable composition.

Other Constituents photoinitiated polymerizable composition may also comprise pigments and/or fillers.

Method of Making the Photoinitiated Polymerizable Composition

The above-described photoinitiated polymerizable composition may be made by combining: the nanogel component; the optional reactive diluent monomer, a reactive oligomer, a resin, or a combination thereof if it/they is/are to be present in the photoinitiated polymerizable composition; the photoinitiator; and the wavelength compatible radiation absorber.

Three-Dimensional Printing with the Photoinitiated Polymerizable Composition

A photoinitiated polymerizable composition of the present invention may be used in essentially any process and device for conducting 3D printing, including, for example, stereo lithograph apparatus (SLA), digital light processing (DLP), continuous liquid interface production (CLIP), and polyjet/inkjet printing. Regardless of the particular method/device, the method generally comprises sequentially exposing immediately adjacent volumes of the photoinitiated polymerizable composition to curing radiation thereby initiating the polymerization of the polymerizable composition in said volumes to form corresponding sequential immediately adjacent layers of the three-dimensional object until the three-dimensional object is completed.

Examples

Production of Nanogel

Figure 2:
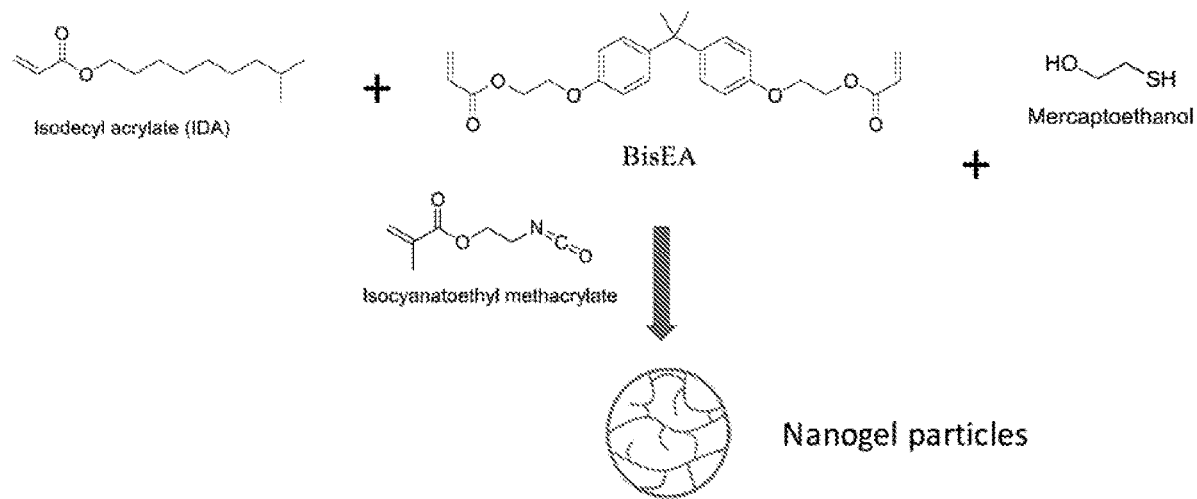
FIG. 2 depicts the copolymerization of isodecyl acrylate (IDA) and ethoxylated bisphenol (monovinyl and divinyl comonomers, respectively) in 2-butanone (solvent) with mercaptoethanol (chain transfer agent) to form nanogel particles that are subjected to post-polymerization modification with isocyanatoethyl methacrylate to yield nanogel particles with reactive groups.

Isodecyl acrylate, a monovinyl monomer, and ethoxylated bisphenol A diacrylate (BisEA), a divinyl monomer, were copolymerized in solution with mercaptoethanol (a chain transfer agent) to control the primary chain lengths and the resultant nanogel particle dimensions. The solution comprises about 60 mol % of isodecyl acrylate, about 40 mol % of BisEA, and about 15 mol % of mercaptoethanol. The isodecyl acrylate is the primary constituent that tended to decrease the bulk nanogel $T_g$. The ethoxylated bisphenol A diacrylate (BisEA) served as the crosslinker and tended to raises the bulk nanogel $T_g$ (FIG. 2). A post-polymerization modification of the nanogel with was conducted with isocyanatoethyl methacrylate to impart reactive functional groups to the nanogel. In this instance the nanogel had a low bulk nanogel $T_g$ of about −20° C. and was measured by light scattering in the TD-GPC to have a hydrodynamic radius ($R_h$) of about 4 nm. This produced a fluid liquid bulk nanogel that could be used with or without reactive monomer dilution.

Lithographic Resolution Testing

The foregoing nanogel was formulated with triethylene glycol dimethacrylate (TEGDMA) at 25 wt %, 50 wt % and 75 wt % using 0.5 wt % of diphenyl(2,4,6-trimethylbenzoyl) phosphine oxide (TPO) as a 405 nm active photoinitiator and 0.01 M Tinuvin Carboprotect as a UV/vis absorber.

Figure 3:
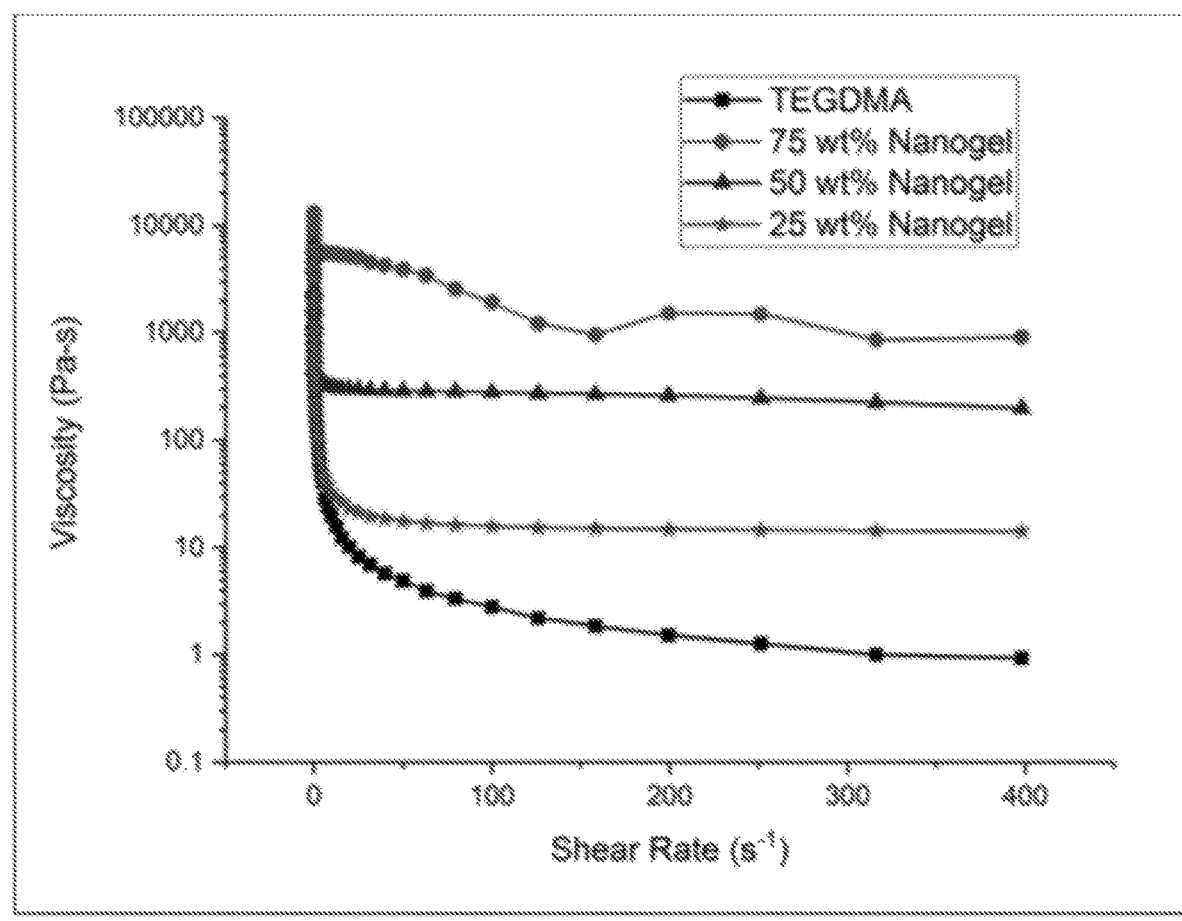
FIG. 3 is a graph of rheologic testing conducted on nanogel-TEGDMA formulations.

The rheologic testing of nanogel-TEGDMA formulations demonstrates significant shear thinning behavior for all compositions (FIG. 3).

Figure 4:
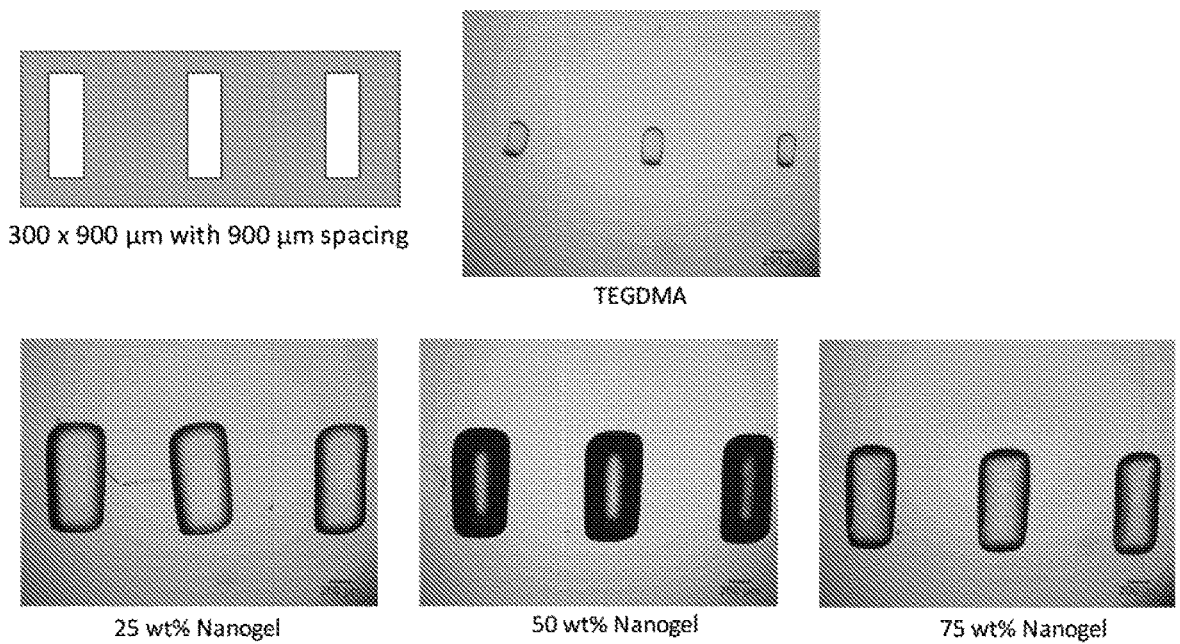
FIG. 4 contains images demonstrating lithographic resolution testing to evaluate the X-Y axis fidelity of nanogel-TEGDMA formulations.
Figure 5:
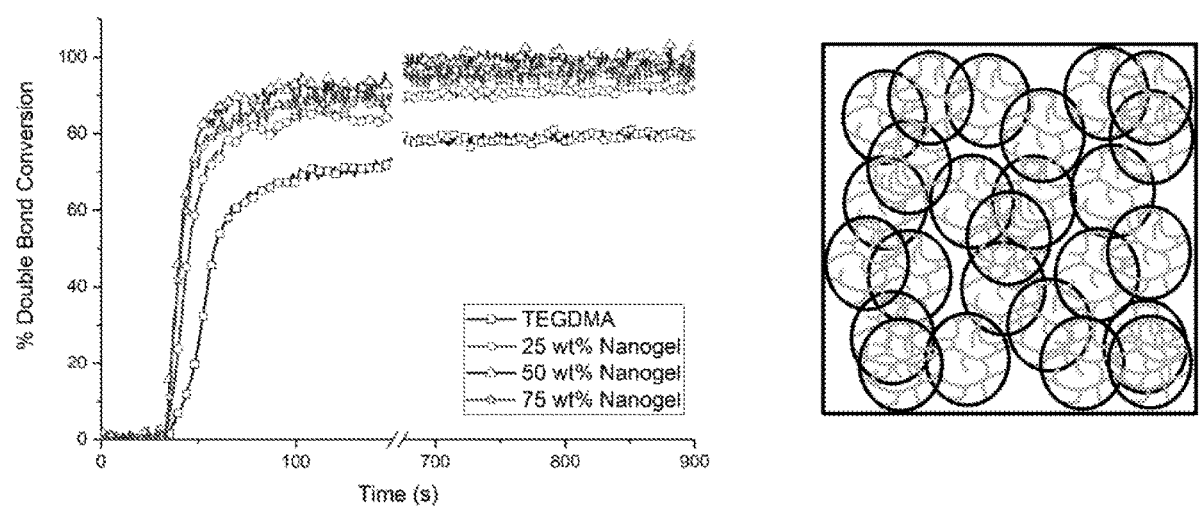
FIG. 5 is a graph of the polymerization kinetics of nanogel-TEGDMA formulations and a depiction of the reaction of reactive groups in the nanogel particles reacting with monomer.

Lithographic resolution testing with the first printable resin formulation was conducted using the 3D printer in a 2D manner to evaluate X/Y axis fidelity to the digital print design. When TEGDMA was used as the printing material, it is apparent that both the length and the width of the intended printed layer is dramatically reduced relative to the patterned exposure area (FIG. 4). In contrast, the addition of nanogel to this monomer at various loading levels produces printed dimensions that agree well with the input pattern. This underrepresentation of the targeted print dimension in the case of TEGDMA homopolymer is believed to be due to a combination of factors such as its significantly greater polymerization shrinkage and a substantially greater loss of unreacted monomer within the patterned region during the washing solvent step that follows printing. The lower reactivity and extent of polymerization for TEGDMA homopolymer versus the corresponding nanogel-modified formulations is also believed to responsible for the undersized printing with TEGDMA. Nanogel-loaded samples exhibited significantly faster polymerization kinetics and reached higher final double bond conversion as compared with the TEGDMA control (FIG. 5), based on real-time near-IR data. The nanogels serve as nanoreactors for the infiltrated monomers that co-react with the polymerizable groups within the nanogel particles. The confined space is believed to produce faster polymerization and a fundamentally different polymerization process relative to typical chain-growth polymer network formation. It has been demonstrated that at ~50 wt % nanogel loading, there is a confluent nanogel physical network present prior to polymerization. When extending to even higher levels of nanogel loading, the overlapping inter-digitation of the confluent nanogels based on their short primary chain construction is further enhanced.

Figure 6:
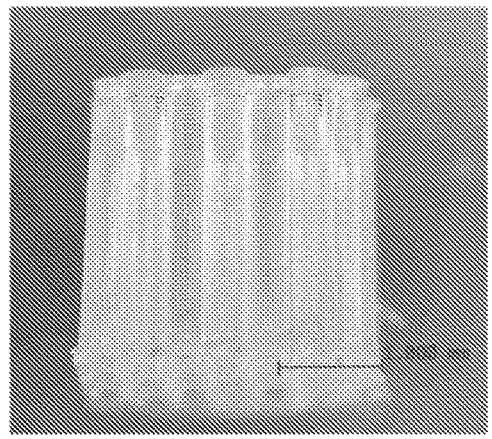
FIG. 6 contains photographic images of 3D printed columns of a TEGDMA control (without nanogel particles) and a nanogel swollen with TEGDMA, wherein the TEGDMA control has significant striations between layers of cured polymer and the nanogel swollen with TEGDMA has a much smoother surface.
Figure 6:
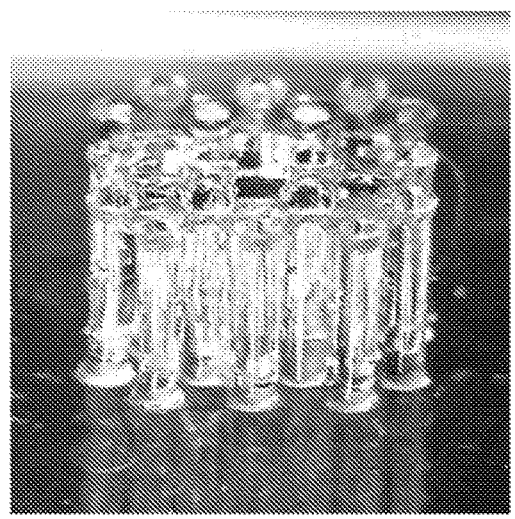

The initial layered printing with the control and nanogel-modified formulation demonstrated some significant differences. Upon solvent washing the TEGDMA control printed part, striations between layers were very evident while the nanogel-modified version produced smooth wall structure (FIG. 6).

Figure 7:
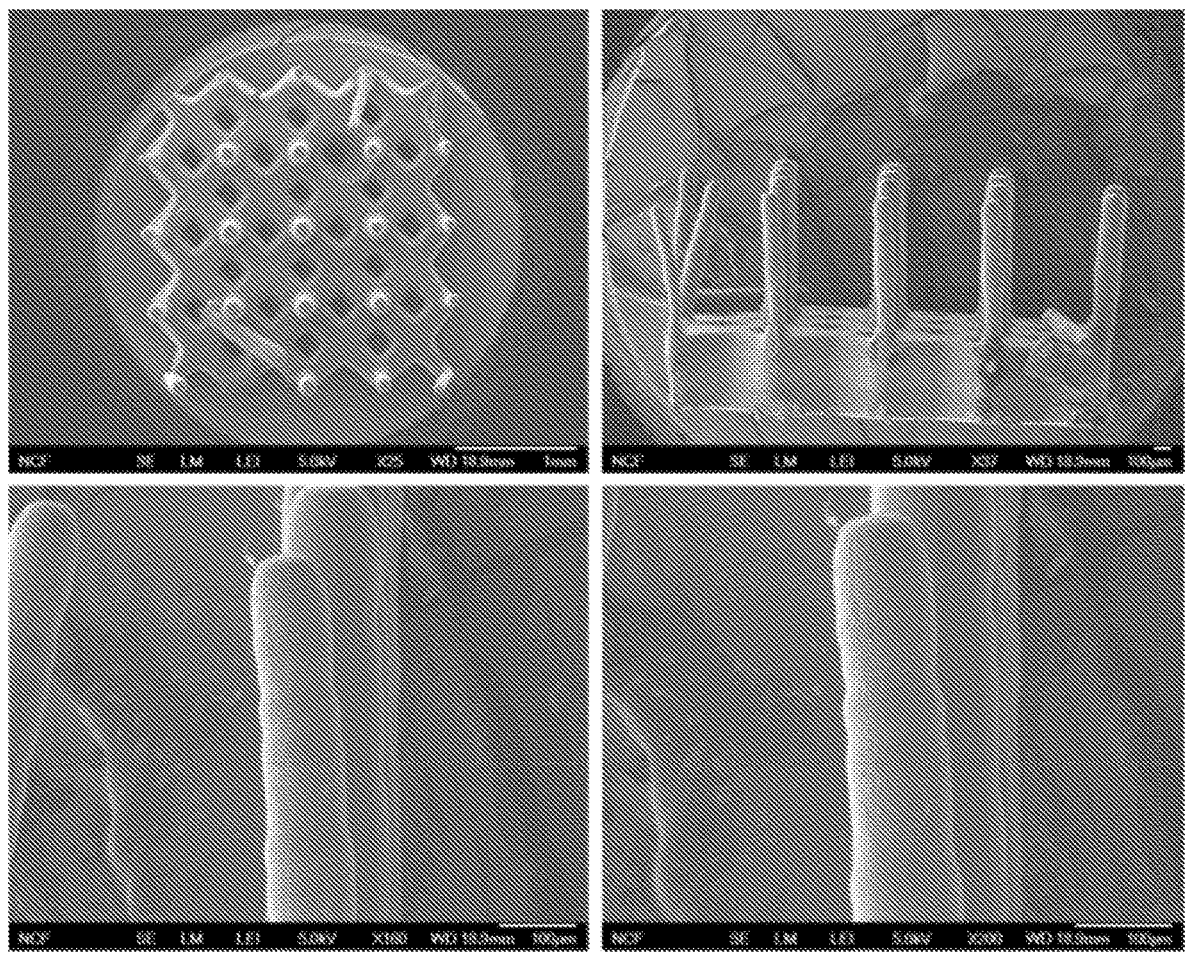
FIG. 7 contains SEM images of 3D printed 200 μm diameter pillars of TEGDMA (20 μm layer thicknesses).
Figure 8:
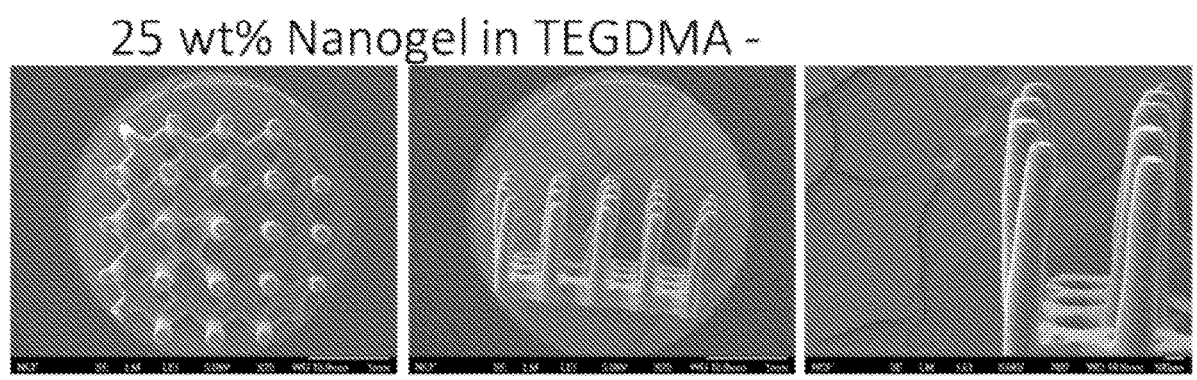
FIG. 8 contains SEM images of 3D printed 200 μm diameter pillars of a 25% nanogel-75% TEGDMA formulation (20 μm layer thicknesses).
Figure 9:
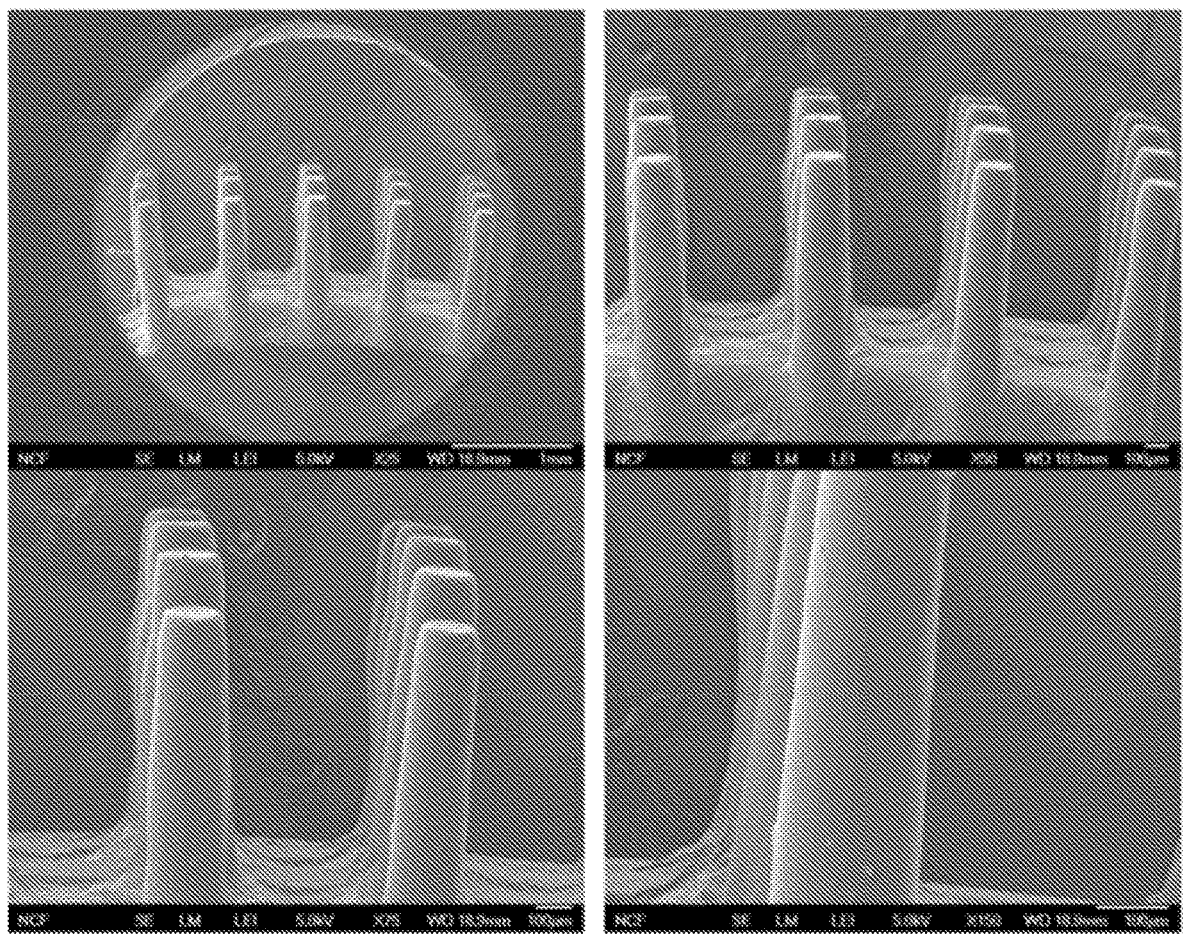
FIG. 9 contains SEM images of 3D printed 200 μm diameter pillars of a 50% nanogel-50% TEGDMA formulation (20 μm layer thicknesses).
Figure 10:
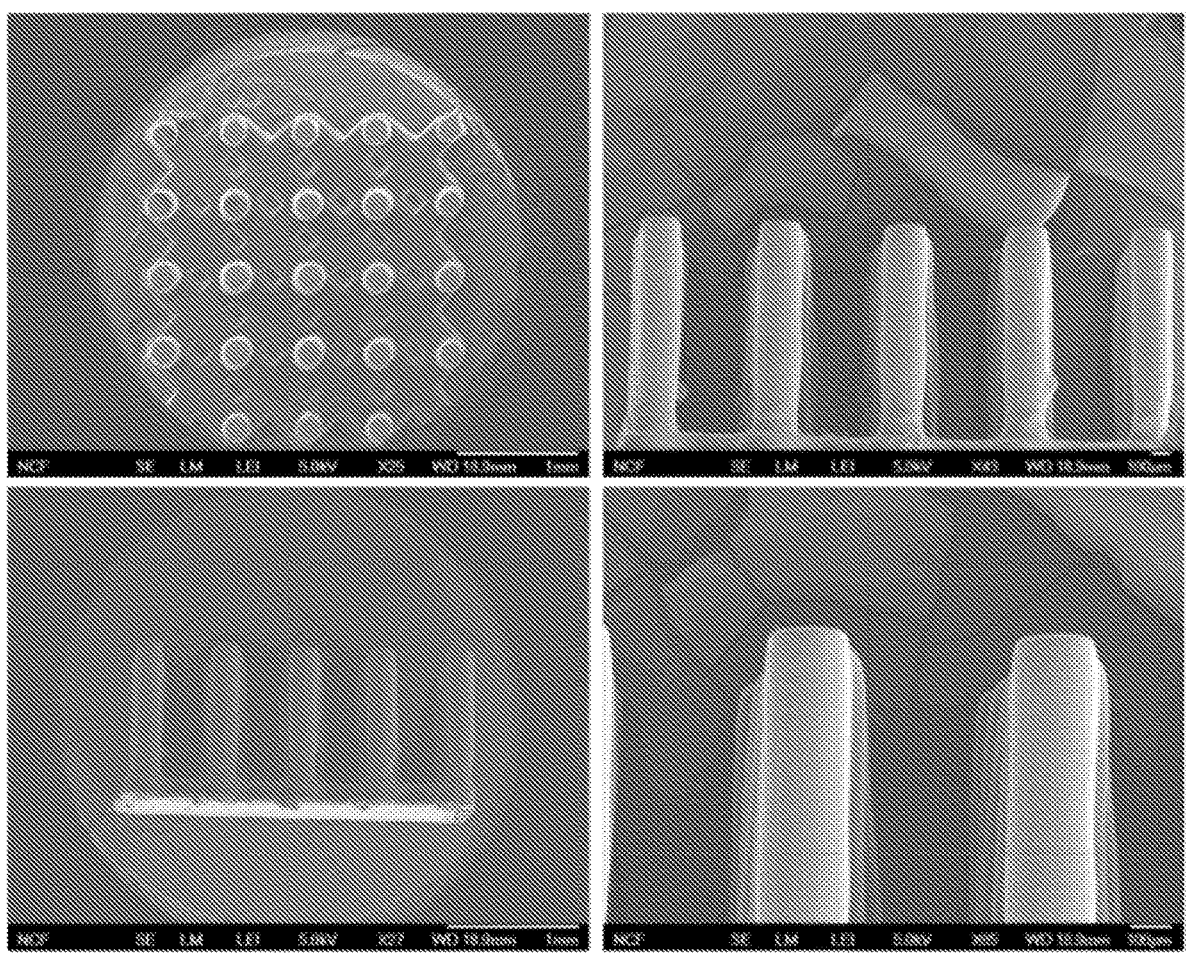
FIG. 10 contains SEM images of 3D printed 200 μm diameter pillars of a 75% nanogel-25% TEGDMA formulation (20 μm layer thicknesses).
Figure 11:
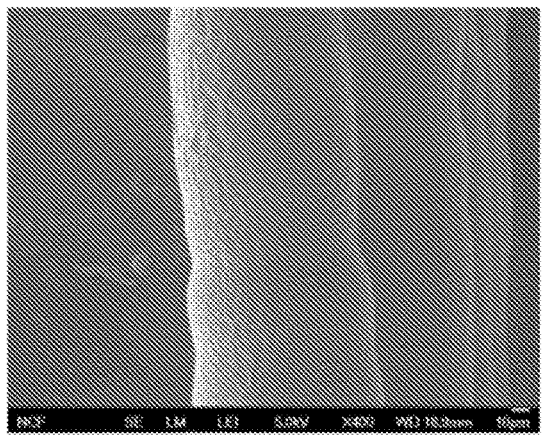
FIG. 11 contains SEM images of 3D printed 200 μm diameter pillars of TEGDMA (left image) and of a 75% nanogel-25% TEGDMA formulation (right image).
Figure 11:
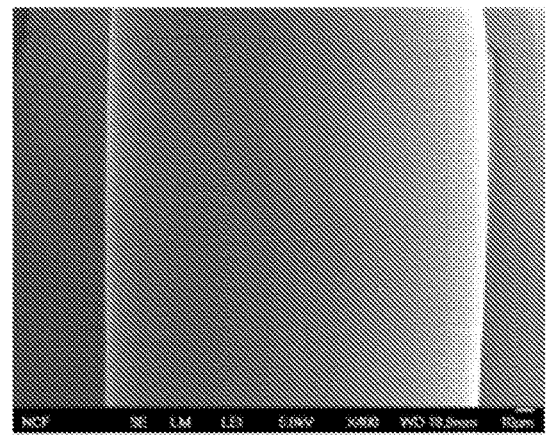

In additional 3D printing work using TEGDMA monomer alone, 200 µm diameter pillars with 25 µm layer size were printed (10 mW/cm² at 405 nm). As can be seen using scanning electron microscopy (FIG. 7), there is significant distortion of shape due to shrinkage effects. Many pillars were broken due to the weak structures. The top view shows the tapered nature of the pillars. A closer look reveals the presence of surface wrinkling, as clear sign of stresses in the material. The barreling effect is due to the layer by layer printing and the diffusion of monomers across layers or uncured monomer getting washed out upon solvent wash post printing. With incremental addition of the reactive nanogel (25 wt %—FIG. 8; 50 wt %—FIG. 9; 75 wt %—FIG. 10) to TEGDMA, there is still some pillar barreling striations and end tapering with 25 wt % nanogel, which corresponds to a percolated but not confluent level of nanogel loading. Without the confluent nanogel loading, there are diffusional pathways still available that clearly affect the integrity and resolution of the printed part. However, with nanogel addition raised to 50 wt % that does reach the confluence threshold, there is a marked further improvement in the quality of the printed structure. The pillars look less distorted along the length and there is very little tapering at the tips. At 75 wt % nanogel loading, the pillars look near perfect and identical to each other with uniformity in all dimensions. The surfaces of the pillars are very smooth at all magnifications being used and the corners are sharp. As a final comparison, the TEGDMA homopolymer showed surface wrinkling as the submicron level (FIG. 11), which is indicative of stresses in the material. Compared to this, the 75 wt % nanogel loaded sample showed an extremely smooth surface, which indicates internal stresses are significantly reduced. Low shrinkage and low stress combined with high conversion undoubtedly lead to better printed parts as compared to materials that experience high shrinkage and monomer migration. The comparison of the pillar dimensions for the TEGDMA control material and the 75 wt % nanogel formulation highlights the accurate rendering of the intended patterned 200 µm pillar as compared with the significantly diminished TEGDMA pillar thickness.

Dark Curing in Partially Cured Samples

The foregoing nanogel was formulated with triethylene glycol dimethacrylate (TEGDMA) at 20 wt % using 0.5 wt % DMPA at the photoinitiator and 0.02 wt % Tinuvin Carboprotect as the absorber.

Figure 12:
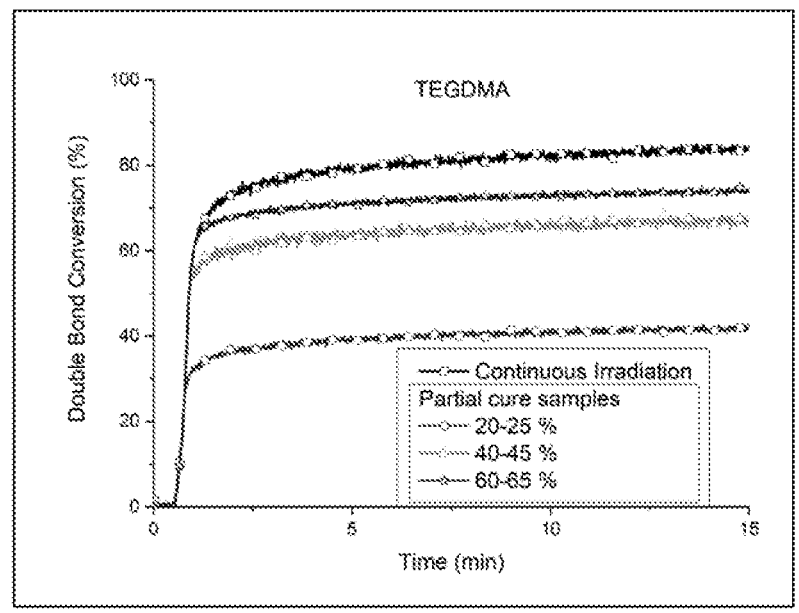
FIG. 12 is a graph of the polymerization kinetics of nanogel-TEGDMA formulations upon irradiation being stopped at partial conversions as indicated in the legend.
Figure 12:
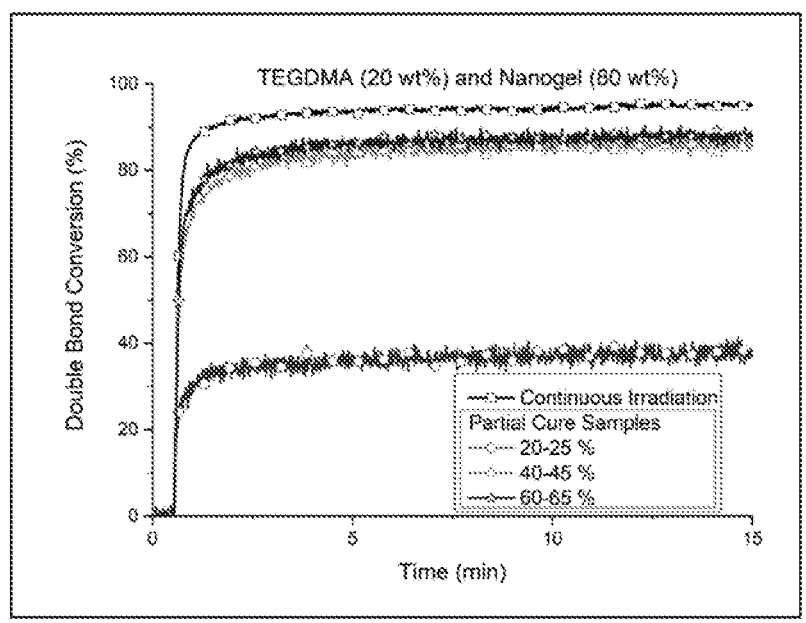

Samples of the 80:20 nanogel:TEGDMA formulation and 100% TEGDMA with the aforementioned photoinitiator and absorber were polymerized between salt plates to result in film thicknesses that were less than 10 microns. Irradiation was stopped at partial conversions according to the range shown in the legend of FIG. 12 and polymerization was monitored in the dark. The nanogel samples showed significant dark cure as compared to the TEGDMA monomer alone. Continuously irradiated samples were the control in both the cases.

Overall Conversion in Layer-by-Layer Printing

The foregoing nanogel was formulated with triethylene glycol dimethacrylate (TEGDMA) at 20 wt % using 0.5 wt % DMPA at the photoinitiator and 0.02 wt % Tinuvin Carboprotect as the absorber.

Figure 13:
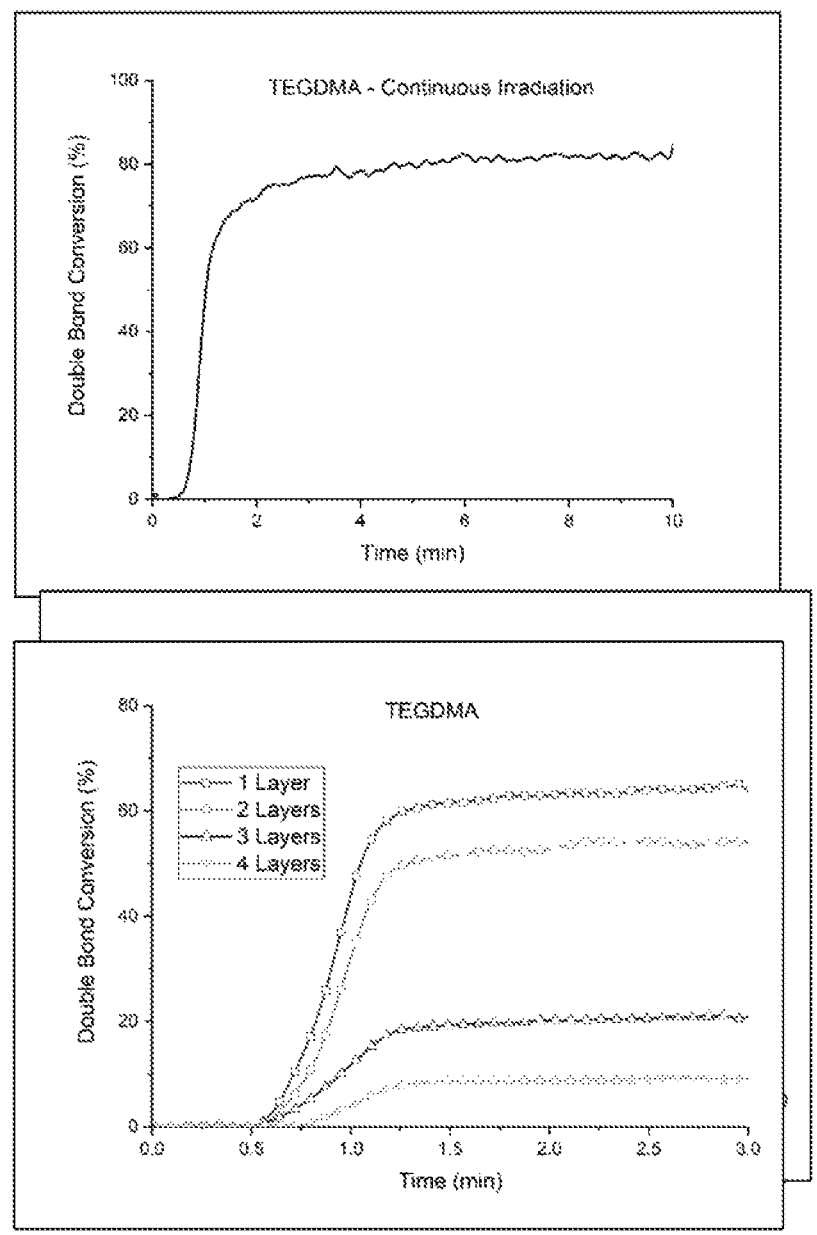
FIG. 13 is a graph of the polymerization kinetics of a TEGDMA standard applied in successive layers.

The test involved layer-by-layer printing done outside a printer and manually polymerizing one layer on top of the other in near-IR. The light was as 365 nm and 10 mW/cm² with a 40 s pulse for each layer. A continuous irradiation sample is shown as comparison for the maximum conversion possible under the given conditions. TEGDMA showed a huge reduction in overall conversion after each layer was polymerized (FIG. 13). To be clear, the data displayed in FIG. 13 shows the overall conversion for the layers after each layer is polymerized and not the degree of conversion of each individual layer.

Figure 14:
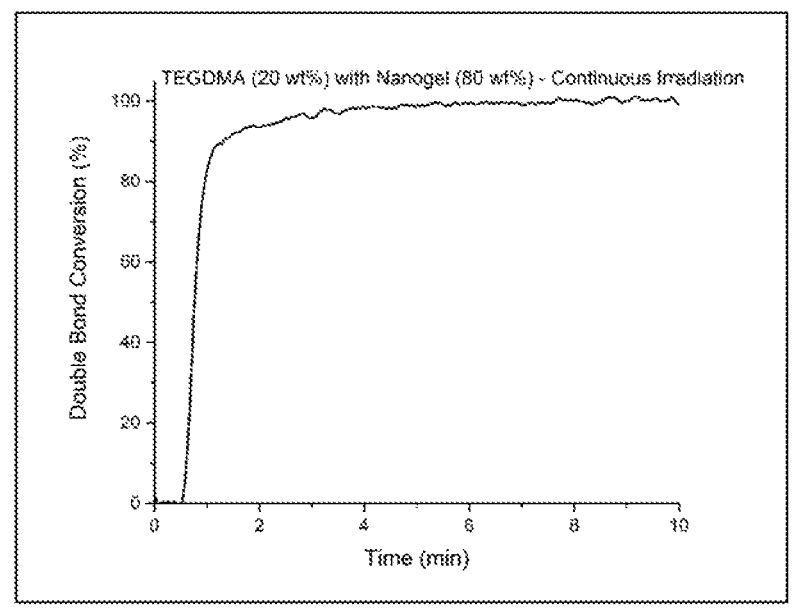
FIG. 14 is a graph of the polymerization kinetics of a 80:20 nanogel:TEGDMA formulation applied in successive layers.
Figure 14:
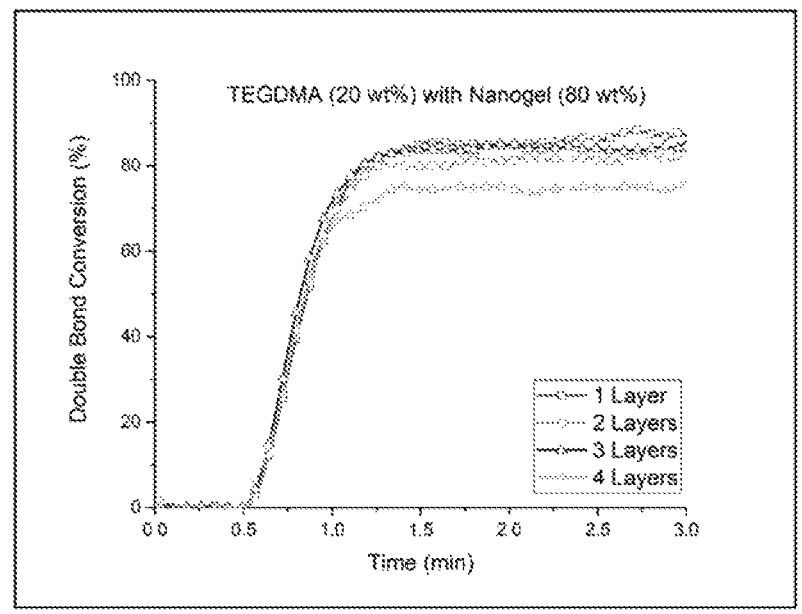

Subjecting TEGDMA with nanogels (80 wt %) to the same irradiation conditions resulted in a much higher overall conversion for the continuously irradiated sample (FIG. 14). There was a much higher overall conversion after each layer as compared to the TEGDMA control. This could be due to low $T_g$ of nanogels, more interpenetration of nanogels and assistance from TEGDMA to increase polymerization rate in confined environments.

Figure 15:
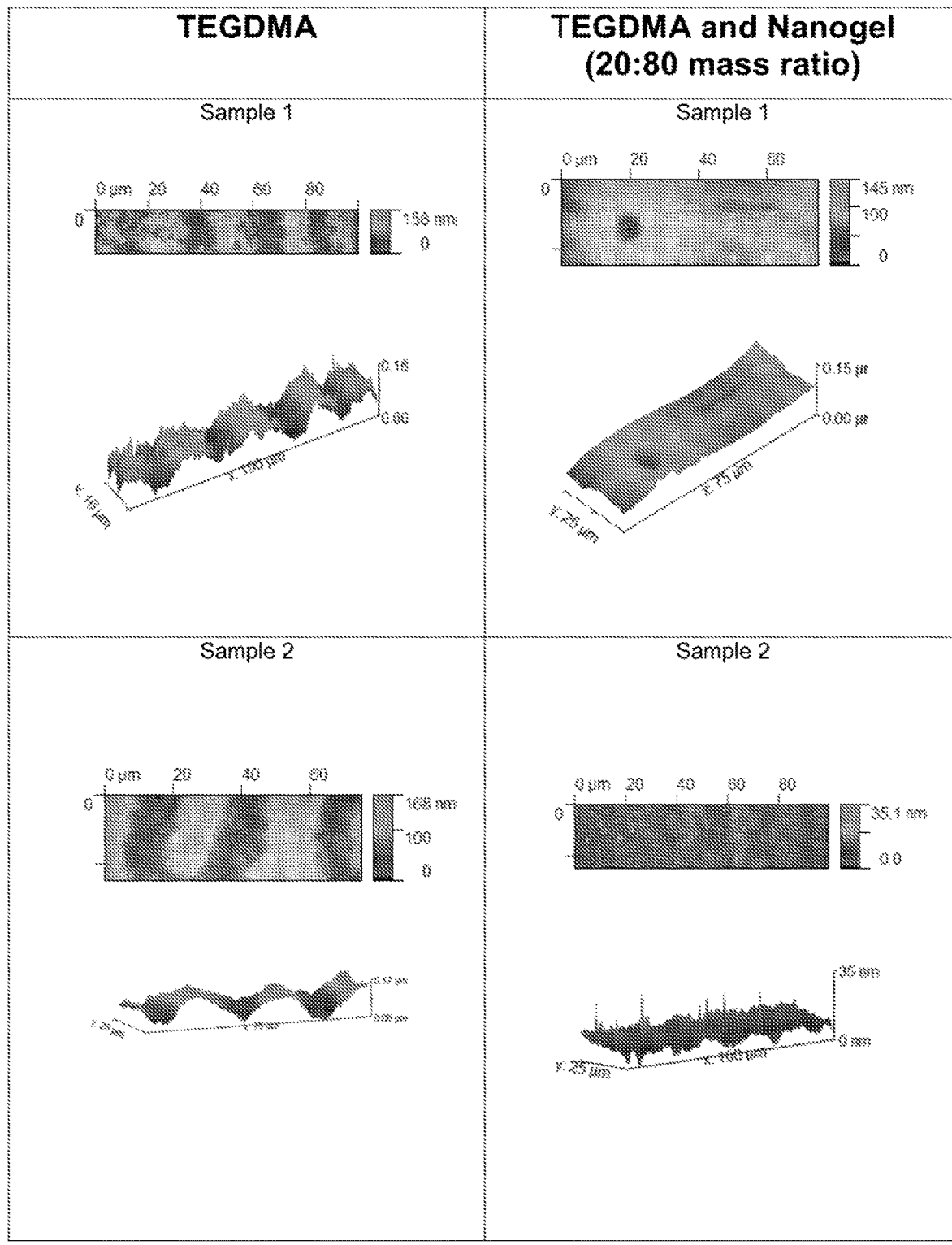
FIG. 15 contains atomic force microscopy profiles of the surfaces of TEGDMA and 80 nanogel:20 TEGDMA samples.

The foregoing samples were also evaluated using atomic force microscopy, the profiles therefrom are set forth in FIG. 15. The AFM profiles demonstrate that, in the absence of nanogel (TEGDMA alone), the spacing of the undulations on the surface of the printed part agree with the layer thickness used in the printing. This reflects the swelling of monomer into regions of higher conversion that are monomer depleted as well as regions of low conversion rich in monomer that lose unreacted monomer during the solvent wash step. With the nanogel present (80 wt % nanogel with 20 wt % TEGDMA), the surface is significantly more uniform in terms of random roughness and periodic ariation. The AFM results agree with the SEM images of printed TEGDMA versus printed nanogel/TEGDMA materials.

Having illustrated and described the principles of the present invention, it should be apparent to persons skilled in the art that the invention can be modified in arrangement and detail without departing from such principles.

Although the materials and methods of this invention have been described in terms of various embodiments and illustrative examples, it will be apparent to those of skill in the art that variations can be applied to the materials and methods described herein without departing from the concept, spirit and scope of the invention. All such similar substitutes and modifications apparent to those skilled in the art are deemed to be within the spirit, scope and concept of the invention as defined by the appended claims.

What is claimed is:

1. A photoinitiated polymerizable composition for 3D printing, the polymerizable composition comprising:
   (a) a nanogel component that comprises nanogel particles, wherein the nanogel particles comprise a copolymer with polymerizable reactive groups suitable for reacting with each other or with a reactive diluent monomer, a reactive oligomer, a resin, or a combination thereof that is present in the polymerizable composition upon photoinitiation, wherein:
      (i) the copolymer is the polymerized product of a mixture that comprises a monovinyl monomer, a divinyl monomer, and a chain transfer agent, wherein the divinyl monomer is at a concentration in a range of about 20 mol % to about 80 mol % of the monomer content of the mixture;
      (ii) the polymerizable reactive groups of the copolymer are at a concentration that is in a range of about 5% to about 20% of the reactive group density of the divinyl monomer;
      (iii) at least one of the monovinyl monomer and the divinyl monomer is a glassy polymer when homopolymerized and at least one of the monovinyl monomer and the divinyl monomer is a rubbery polymer when homopolymerized;
      (iv) the nanogel component has a glass transition temperature ($T_g$), corresponding to the peak of a tan delta plot created via Dynamic Mechanical Analysis (DMA), is in a range of about −50° C. and about 20° C.;
      (v) the nanogel component has an average molecular weight ($M_n$),
   determined with triple-detector gel permeation chromatography (TD-GPC) analysis, that is in a range of about 10 kg/mol and about 100 kg/mol; and
      (vi) the nanoparticles have an average hydrodynamic radius ($R_h$), determined by light scattering while conducting a TD-GPC analysis, that is in a range of 1 nm to about 5 nm; and
   (b) optionally, the reactive diluent monomer, a reactive oligomer, a resin, or a combination thereof at a concentration up to about 60 wt % of the polymerizable composition;
   (c) a photoinitiator at an amount effective to initiate said reactions in the presence of curing radiation of appropriate wavelength and irradiance; and
   (d) a wavelength compatible radiation absorber at an amount effective for control of radiation transmission depth of the curing radiation.

2. The photoinitiated polymerizable composition of claim 1, wherein the $T_g$ of the nanogel component is in a range of about −20° C. and about −10° C. and the $M_n$ of the nanogel component is in a range of about 15 kg/mol and about 30 kg/mol.

3. The photoinitiated polymerizable composition of claim 1, wherein:

the nanogel component is at an amount in a range of about 40 wt % to about 90 wt % of the photoinitiated polymerizable composition;

the reactive diluent monomer, a reactive oligomer, a resin, or a combination thereof, if present, is at an amount up to about 50 wt % of the photoinitiated polymerizable composition;

the photoinitiator is at an amount in a range of about 0.01 wt % to about 10 wt % of the photoinitiated polymerizable composition; and the wavelength compatible radiation absorber is at an amount in a range of about 0.005 wt % to about 5 wt % of the photoinitiated polymerizable composition.

4. The photoinitiated polymerizable composition of claim 1, wherein:

the nanogel component is at an amount in a range of about 50 wt % to about 80 wt % of the photoinitiated polymerizable composition;

the reactive diluent monomer, a reactive oligomer, a resin, or a combination thereof is at an amount in a range of about 20 wt % to about 50 wt % of the photoinitiated polymerizable composition;

the photoinitiator is at an amount in a range of about 0.05 wt % to about 7 wt % of the photoinitiated polymerizable composition; and the wavelength compatible radiation absorber is at an amount in a range of about 0.05 wt % to about 2 wt % of the photoinitiated polymerizable composition.

5. The photoinitiated polymerizable composition of claim 1, wherein:

the nanogel component is at an amount in a range of about 60 wt % to about 75 wt % of the photoinitiated polymerizable composition;

the reactive diluent monomer, a reactive oligomer, a resin, or a combination thereof is at an amount in a range of about 20 wt % to about 50 wt % of the photoinitiated polymerizable composition;

the photoinitiator is at an amount in a range of about 0.1 wt % to about 5 wt % of the photoinitiated polymerizable composition; and the wavelength compatible radiation absorber is at an amount in a range of about 0.1 wt % to about 1 wt % of the photoinitiated polymerizable composition.

6. The photoinitiated polymerizable composition of claim 1, wherein the chain transfer agent is selected from the group consisting of aliphatic and aromatic monofunctional thiols, difunctional thiols, trifunctional thiols, tetrafunctional thiols, pentafunctional thiols, hexafunctional thiols, octafunctional thiols, and bis(borondifluorodimethylglyoximate) cobaltate (II).

7. The photoinitiated polymerizable composition of claim 1, wherein:

the monovinyl monomer is selected from the group consisting of (meth)acrylates, styrene and derivatives thereof (styrenics), vinyl acetate, maleic anhydride, itaconic acid, N-alkyl (aryl) maleimides and N-vinyl pyrrolidone, vinyl pyridine, acrylamide, methacrylamide, N,N-dialkylmethacrylamides and acrylonitrile, and combinations thereof;

the divinyl monomer is selected from the group consisting of ethylene glycoldi(meth)acrylate, urethane di(meth)acrylate (UD(M)A), 2,2'-bis [4-(3-(meth)acryloxy-2-hydroxy propoxy)-phenyl] propane (bis-G(M)A), ethoxylated bisphenol-A-di(meth)acrylate (BisEMA), hexanediol di(meth)acrylate, poly(ethylene glycol) di(meth)acrylate, tripropylene glycol di(meth)acrylate, butanediol di(meth)acrylate, neopentyl glycol di(meth) acrylate, diethylene glycol di(meth)acrylate, triethylene glycol di(meth)acrylate, tetraethylene glycol di(meth)acrylate, dipropylene glycol di(meth)acrylate, allyl (meth)acrylate, divinyl benzene, 1,3-diglycerolatediacrylate, N,N-methylene bisacrylamide, and combinations thereof; and the chain transfer agent is selected from the group consisting of is selected from the group consisting of propyl mercaptan, butyl mercaptan, hexyl mercaptan, octyl mercaptan, dodecanethiol, thioglycolic acid, methylbenzenethiol, dodecanethiol, mercaptopropionic acid, 2-ethyl hexyl thioglycolate, octylthioglycolate, mercaptoethanol, mercaptoundecanoic acid, thiolactic acid, thiobutyric acid, trimethylol propane tris(3-mercaptopropionate), pentaerythritol tetra(3-mercaptopropionate), pentaerythritol tetrathioglycolate, pentaerythritol tetrathiolactate, pentaerythritol tetrathiobutyrate; dipentaerythritol hexa(3-mercaptopropionate), dipentaerythritol hexathioglycolate; tripentaerythritol octa (3-mercaptopropionate), and tripentaerythritol octathioglycolate, and combinations thereof.

8. The photoinitiated polymerizable composition of claim 7, wherein the monovinyl monomer is one or more (meth) acrylates selected from the group consisting of methyl(meth) acrylate, ethyl (meth)acrylate (EMA), propyl (meth)acrylate, n-butyl (meth)acrylate, iso-butyl (meth)acrylate, t-butyl (meth)acrylate, 2-ethylhexyl (meth)acrylate octyl (meth) acrylate, dodecyl (meth)acrylate, isodecyl methacrylate (IDMA), isostearyl (meth)acrylate, isobornyl methacrylate (IBMA), 2-ethylhexyl methacrylate (EHMA), hybrid acrylate/methacrylate prepared by the reaction of hydroxyethyl acrylate and isocyanatoethyl methacrylate (HEA+IEM), 2-phenoxyethyl (meth)acrylate, phenyl (meth)acrylate, p-t-butylphenyl (meth)acrylate, p-methoxyphenyl (meth)acrylate, p-tolyl (meth)acrylate, p-cyclohexylphenyl (meth)acrylate, p-nitophenyl (meth)acrylate, and benzoyl (meth) acrylate, 2-napthyl (meth)acrylate, (meth)acrylic acid, and combinations thereof.

9. The photoinitiated polymerizable composition of claim 1, wherein the photoinitiator is selected from one or more of an alpha-hydroxyketone, a benzophenone, a thioxanthone, an alkylaminoacetophenone, an acyl phosphine oxide, and a benzyl ketal, a benzoin ether, a ketocoumain, 1,2-diketon, and combinations thereof.

10. The photoinitiated polymerizable composition of claim 9, wherein the photoinitiator is one or more acyl phosphine oxides selected from the group consisting of bis-acylphosphine oxide (BAPO), 2,4,6-trimethylbenzolyl-diphenylphosphine oxide (TPO), ethyl (2,4,6-trimethylbenzolyldiphenylphosphine oxide) (TPO-L), tris[1-(2-methyl) aziridinyl]phosphine oxide (MAPO), 2,2-dimethoxy-2-phenylacetophenone (DMPA), benzil dimethylketal (BDK), cyclohexylphenylketone (CPK), 2-hydroxy-2-methyl-1-phenyl propanone (HDMAP), isopropylthioxanthrone (ITX), hydroxyethyl-substituted alpha-hydroxyketone (HMPP), 2-methyl-4'-(methylthio)-2-morpholinopropiophenone (MMMP), 2-benzyl-2-dimethylamino-1-(4-morpholinophenyl)-butanone-1 (BDMB), Benzophenone (BP), methylthiophenyl-morpholinoketone (TPMK), 4-Methylbenzophenone, 2-Methylbenzophenone, 1-Hydroxycyclohexyl phenyl ketone, diphenyl iodonium hexafluorophosphate, bis (p-tolyl) iodonium hexafluorophosphate, 2-Methyl-1-[4-(methylthio)phenyl]-2-morpholinopropanone-1, 2-Hydroxy-2-methyl-phenyl-propan-1-one, 1,7-bis(9-acridinyl)heptane, 2-Hydroxy-4'-hydroxyethoxy-2-methylpropiophenone, 2,2-Bis(o-chiorophenyl-4,4',5,5'-tetraphenyl-1,2'-diimidazole, 9-Phenylacridine, N-phenylglycine, 2-(4-methoxyphenyl-4,6-bis(trichloromethyl)-1,3,5-triazine, p-toluene sulfonylamine, tris-(4-dimethylaminophenyl)methane, tribromomethyl phenyl sulfone, 2,4-Bis(trichloromethyl)-6-(p-methoxy)styryl-s-triazine, 2,4-bis(trichloromethyl)-6-(3,4-dimethoxy)styryl-s-triazine, 4-(2-aminoethoxy)methyl benzophenone, 4-(2-hydroxyethoxy)methyl benzophenone, 2-Isopropylthioxanthone, 4-Isopropylthioxanthone, 4-Hydroxy benzophenone, 4-Methyl acetophenone, 4-(4-Methylphenylthiophenyl)-phenylmethanone, dimethoxyphenylacetophenone, camphorquinone, 1-Chloro-4-propoxythioxanthone, 2-Chlorothioxanthone, 2,2-Diethoxyacetophenone, 2,4-Diethylthioxanthone, 2-Dimethyl-aminoethylbenzoate, 2-Ethylhexyl-4-dimethylaminobenzoate, Ethyl-4-(dimethylamino) benzoate, 2-Isopropylthioxanthone, Methyl o-benzoyl benzoate, Methyl phenyl glyoxylate, 4,4'-Bis(diethylamino) benzophenone, 4-Phenylbenzophenone, 2,4,6- and Ethyl (2,4,6-trimethylbenzoyl) phenylphosphinate.

11. The photoinitiated polymerizable composition of claim 1, wherein the wavelength compatible radiation absorber is selected from the group consisting of benzophenones, benzotriazoles, triazines, titanium dioxide, zinc oxide, carbon black, and combinations thereof.

12. A method of making the photoinitiated polymerizable composition of claim 1, the method comprising combining:
   the nanogel component;
   the optional reactive diluent monomer, a reactive oligomer, a resin, or a combination thereof if it/they is/are to be present in the photoinitiated polymerizable composition;
   the photoinitiator; and
   the wavelength compatible radiation absorber.

13. A method of producing a three-dimensional object from the photoinitiated polymerizable composition of claim 1, the method comprising sequentially exposing immediately adjacent volumes of the photoinitiated polymerizable composition to curing radiation thereby initiating the polymerization of the polymerizable composition in said volumes to form corresponding sequential immediately adjacent layers of the three-dimensional object until the three-dimensional object is completed.

* * * * *